United States Patent [19]

Akiba et al.

[11] Patent Number: 5,714,050

[45] Date of Patent: Feb. 3, 1998

[54] METHOD OF PRODUCING A BOX-SHAPED CIRCUIT BOARD

[75] Inventors: Yoshinobu Akiba; Makoto Katsumata; Hitoshi Ushijima; Hidenori Yamanashi, all of Shizuoka, Japan

[73] Assignee: Yazaki Corporation, Tokyo, Japan

[21] Appl. No.: 592,488

[22] Filed: Jan. 26, 1996

[30] Foreign Application Priority Data

Jan. 26, 1995 [JP] Japan .................................. 7-010514

[51] Int. Cl.$^6$ .................................. C25D 1/00; H05K 3/20
[52] U.S. Cl. .................................. 205/78; 156/150; 156/245; 205/125
[58] Field of Search .................. 205/78, 125; 156/150, 156/245

[56] References Cited

U.S. PATENT DOCUMENTS

| | | | |
|---|---|---|---|
| 2,692,190 | 10/1954 | Pritikin | 216/20 |
| 2,874,085 | 2/1959 | Brietzke | 156/150 |
| 3,350,250 | 10/1967 | Sanz et al. | 156/150 |
| 4,584,039 | 4/1986 | Shea | 156/150 |
| 4,606,787 | 8/1986 | Pelligrino | 156/632.1 |

FOREIGN PATENT DOCUMENTS

| | | | |
|---|---|---|---|
| 50-113766 | 6/1975 | Japan | H05K 3/18 |
| 63-117493 | 5/1988 | Japan | H05K 3/20 |
| 2-28992 | 1/1990 | Japan | H05K 3/20 |

*Primary Examiner*—Bruce F. Bell
*Assistant Examiner*—William T. Leader
*Attorney, Agent, or Firm*—Sughrue, Mion, Zinn, Macpeak & Seas, PLLC

[57] ABSTRACT

A method of producing a circuit board includes the steps of: electroplating a mold surface of a mold so that a circuit body made of a metal plating layer is formed on the mold surface of the mold; pressing the mold against a board made of a thermoplastic resin; heating and retaining the mold so that the circuit body is bonded to the board under heat and pressure; and releasing the mold from the board after cooling the board to thereby transfer the circuit body to the board. The circuit board may be in the shape of box with the circuit body on the inner surfaces thereof.

2 Claims, 5 Drawing Sheets

METHOD OF PRODUCING A BOX-SHAPED CIRCUIT BOARD

BACKGROUND OF THE INVENTION

The present invention relates to a method of producing a circuit board by bonding under heat and pressure.

Heretofore, a method of producing a circuit board is generally known which comprises the steps of: applying a light-sensitive resin onto the whole surface of a board coated with a metal thin film; coating said board with a corrosion resisting resin film in the form of a wiring pattern by photography; and dissolving and removing (etching) an exposed portion of the metal thin film with a corrosive liquid, whereby a desired circuit board is produced.

A method using electroless plating, is disclosed in Japanese Patent Unexamined Publication No. Sho 50-113766. As shown in FIG. 3, the method comprises the steps of: applying an adhesive agent 3 onto a surface of an electrically insulating board 1 (FIG. 3(A)); immersing the board 1 in an activating solution of palladium chloride to thereby deposit metal palladium nuclei 5 of fine particles onto the board 1 over the whole surface thereof (FIG. 3(B)); printing a wiring pattern by a resist 7 made of a corrosion resisting resin (FIG. 3(C)); dissolving and removing exposed metal palladium nuclei 5 with a corrosive liquid which can dissolve metal palladium (FIG. 3(D)); and precipitating a metal 9 by electroless plating on the metal palladium nuclei 5 remaining in the wiring pattern after dissolving and removing the resist 7, whereby a desired circuit board is produced.

On the other hand, a method in which a circuit pattern is formed on an inner surface of a casing so that the casing per se is used as a circuit board has been proposed in recent years in order to attain reduction in size and weight of electric appliances.

A method of producing a casing serving as a circuit board is disclosed in Japanese Patent Unexamined Publication No. Sho 63-117493. As shown in FIGS. 4(A) and 4(B), the method comprises the steps of: preforming a transfer sheet 13 having a circuit 11 printed with electrically conductive ink and arranging the preformed sheet in molds 15a and 15b for injection molding (FIG. 4(A)); and forming a molding 17 with a three-dimensional circuit body 11 on its surface from a synthetic resin by injection molding and applying metal plating 19 onto the circuit body 11 (FIG. 4(B)), whereby a desired circuit board is produced.

Another method of producing a casing serving as a circuit board has been disclosed in Japanese Patent Unexamined Publication No. Hei 2- 28992. As shown in FIGS. 5(A) and 5(B), the method comprises the steps of: forming a circuit body 23 on a surface of a core 21 (FIG. 5(A)); setting the core 21 in a mold 25 (FIG. 5(B)); feeding a molding resin from a sprue 27 into a cavity 29 to fill the cavity 29 with the molding resin; and taking a molded article out of the mold 25 by opening the mold 25 after cooling and hardening the filled molding resin, whereby a desired circuit board is produced.

However, the aforementioned conventional method using etching has not only an economical disadvantage in that the loss of material is large because an unnecessary portion of the metal film is dissolved and removed with a corrosive liquid but has a problem in that a large time is required for production and the sectional area of the circuit cannot be very large.

The method using electroless plating shown in FIG. 3 has a problem in that not only palladium used as a catalyst is expensive but also bath management of plating solution, temperature, etc. is very troublesome.

On the other hand, the method using the transfer sheet 13 shown in FIG. 4 as a method of producing a casing serving as a circuit board has a problem in that not only there is a risk of lowering of position accuracy caused by expansion of the transfer sheet 13 as well as increase of producing steps such as preforming, etc. but also producing efficiency is lowered because it is difficult to apply electroplating to the inner surface of a three-dimensional shape.

Further, the method in which the circuit body 23 is formed on the core 21 shown in FIG. 5 as a method of producing a casing serving as a circuit board has a disadvantage in that not only the scale of equipment becomes large because a resin pressure feed means and a molding apparatus are required but also the method cannot be applied to a circuit of a large current because the sectional area of the circuit cannot be large enough as described above.

SUMMARY OF THE INVENTION

In view of such circumstances, an object of the present invention is to provide a method of producing a circuit board, in which a circuit body having a large sectional area can be formed with low cost, in a short time and with high positional accuracy to attain the reduction of cost, the reduction of production time, the improvement of accuracy and the increase of allowable electric power.

According to an aspect of the present invention, the forgoing object is achieved by a method of producing a circuit board comprising the steps of: electroplating a mold surface of a mold so that a circuit body made of a metal plating layer is formed on the mold surface of the mold; pressing the mold against a board made of a thermoplastic resin; heating and retaining the mold so that the circuit body is bonded to the board under heat and pressure; and releasing the mold from the board after cooling the board, whereby the circuit body is transferred onto the board side.

According to another aspect of the present invention, the foregoing object is achieved by a method of producing a circuit board comprising the steps of: electroplating a mold surface of a convex mold so that a circuit body made of a metal plating layer is formed on the mold surface of the convex mold; putting a board made of a thermoplastic resin on a concave mold and pressing the board into a cavity of the concave mold by the convex mold in a condition that the board is heated; heating and retaining the convex and concave molds so that the circuit body is bonded to the board under heat and pressure; and releasing the convex mold from the concave mold after cooling the board, whereby the circuit body of a three-dimensional structure is transferred onto an inner surface of a resin molding casing.

Because a circuit body made of a metal plating layer is formed on a mold and the mold is pressed against a board and heated and retained, the circuit body is bonded to the board under heat and pressure so that the circuit board can be produced without the use of electroless plating.

Further, because a circuit body made of a metal plating layer is formed on a mold surface of a convex mold, a board is pressed into a cavity of a concave mold by the convex mold, the convex and concave molds are heated and retained so that the circuit body is bonded to an inner surface of a resin molding casing under heat and pressure while the three-dimensional shape of the circuit body is retained, and the circuit body is arranged with high positional accuracy. Because the circuit body on the convex mold is formed by electroplating by which it is easy to form a thick film, the conductor thickness of the circuit body can be easily selected to be large.

BRIEF DESCRIPTION OF THE DRAWINGS

FIGS. 1(A) to 1(D) are views showing a procedure for production in a first embodiment of the method of producing a circuit board according to the present invention, in which FIG. 1(A) shows an electroplating step, FIG. 1(B) shows a bonding step under heat and pressure, FIG. 1(C) shows a heating and retaining step, and FIG. 1(D) shows a mold removing step.

FIGS. 2(A) to 2(D) are views showing a procedure for forming a three-dimensional circuit body in a second embodiment of the method of producing a circuit board according to the present invention, in which FIG. 2(A) shows an electroplating step, FIG. 2(B) shows a bonding step under heat and pressure, FIG. 2(C) shows a heating and retaining step, and FIG. 2(D) shows a mold removing step.

DETAILED DESCRIPTION OF THE INVENTION

Preferred embodiments of the method of producing a circuit board according to the present invention will be described below in detail with reference to the drawings.

Figure 1:
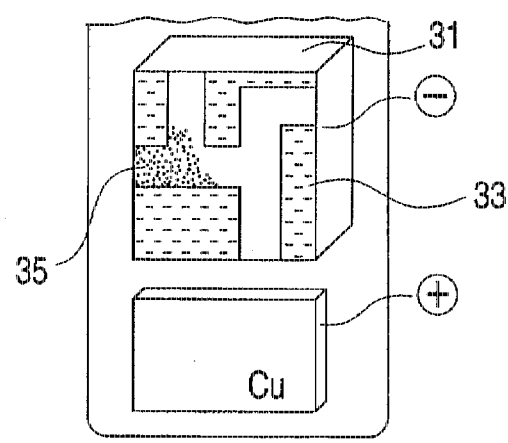
Figure 1:
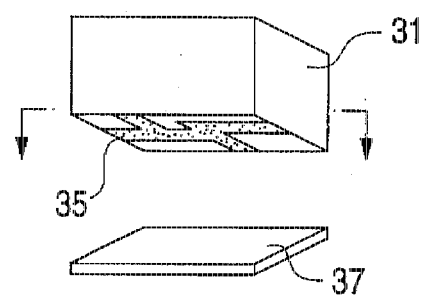
Figure 1:
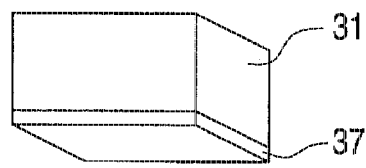
Figure 1:
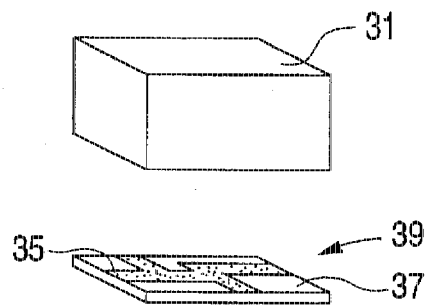

FIGS. 1(A) to 1(D) are views showing a procedure of production in a first embodiment of the method of producing a circuit board according to the present invention. FIG. 1(A) shows an electroplating step, FIG. 1(B) shows a bonding step under heat and pressure, FIG. 1(C) shows a heating and retaining step, and FIG. 1(D) shows a mold removing step.

First, as shown in FIG. 1(A), a mold (convex mold) 31 is masked with a reversed wiring pattern of an electrically insulating tape 33, a resin, or the like, the masked mold 31 is put into a copper plating solution containing a brightener or the like, and electroplating is performed while the solution is stirred, so that a circuit body 35 made of a metal plating layer with a desired thickness is formed on the exposed mold surface. In this embodiment, a conductor is precipitated in the condition of 5 A/dm$^2$ while the solution is stirred, and plating is continued till the thickness of the conductor is in a range of from 100 to 300 μm. In this occasion, electrically conductive paste may be applied onto the mold 31 in advance to improve the releasability of the plating layer.

Then, as shown in FIG. 1(B), the mold 31 from which the masking has been removed is pressed against a board 37 made of a thermoplastic ABS resin and then the mold 31 is heated to perform bonding of the circuit body 35 under heat and pressure. In this embodiment, the mold 31 is pressed in the condition of 10 kg/cm$^2$ and heated to 120° C.

As shown FIG. 1(C), bonding under heat and pressure is performed by heating and retaining the mold 31 till the circuit body 35 comes into close contact with the board 37 sufficiently. In this embodiment, after the aforementioned heating temperature is retained for about 5 minutes, the mold 31 is cooled to room temperature.

Then, as shown in FIG. 1(D), after the mold 31 is cooled till the thermoplastic ABS resin gains a sufficient strength, the mold 31 is released from the board 31 so that the circuit body 35 is transferred to the board 37 side to thereby obtain a circuit board 39.

In the following, another embodiment for forming a three-dimensional circuit body will be described as an applied example of the method of producing a circuit board according to the present invention.

Figure 2:
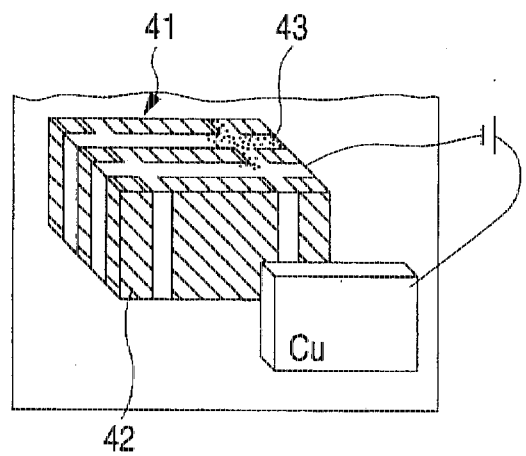
Figure 2:
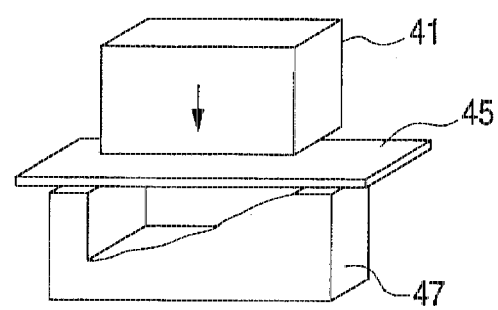
Figure 2:
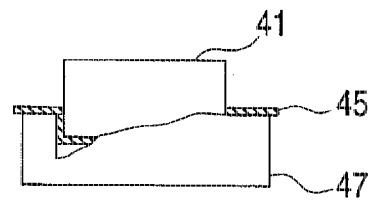
Figure 2:
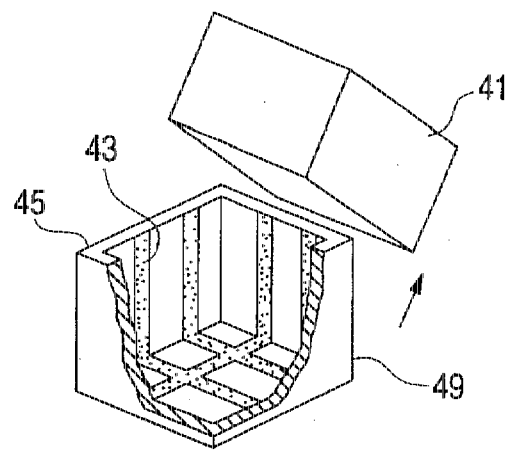
Figure 3:
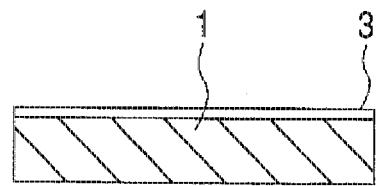
FIGS. 3(A) to 3(E) are views for explaining a conventional method of producing a circuit board by electroless plating.
Figure 3:
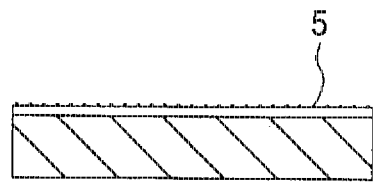
Figure 3:
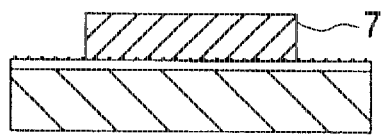
Figure 3:
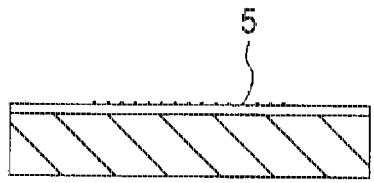
Figure 3:
Figure 4:
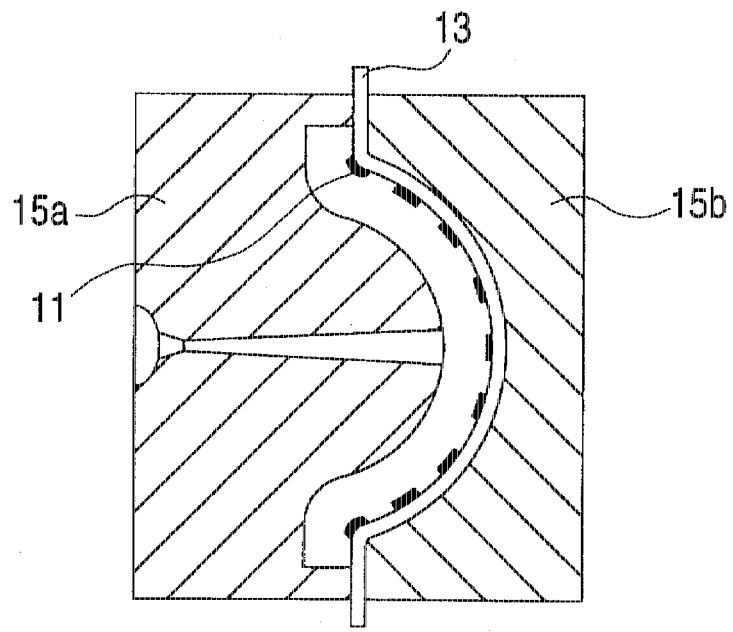
FIGS. 4(A) and 4(B) are views for explaining a conventional method of producing a circuit board by transfer sheet.
Figure 4:
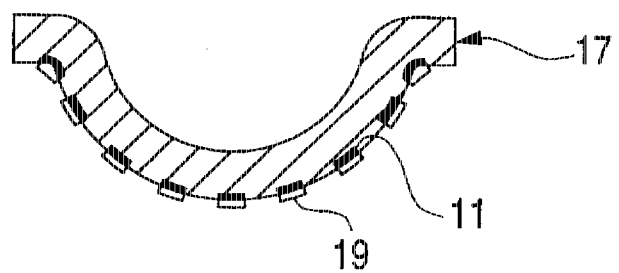
Figure 5:
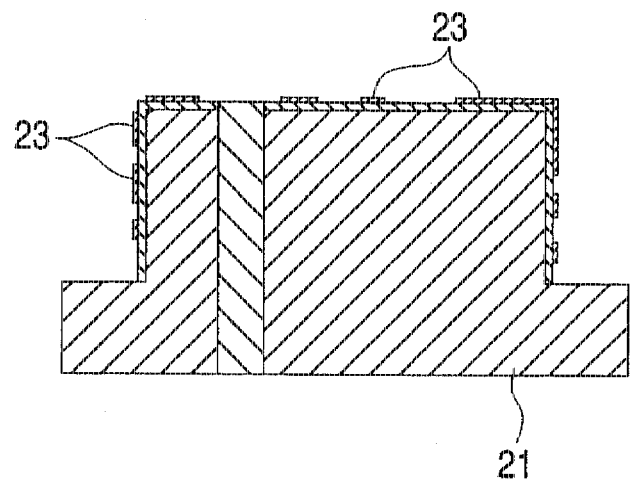
FIGS. 5(A) and 5(B) are views for explaining a conventional method of producing a circuit board by use of a circuit body forming core.
Figure 5:
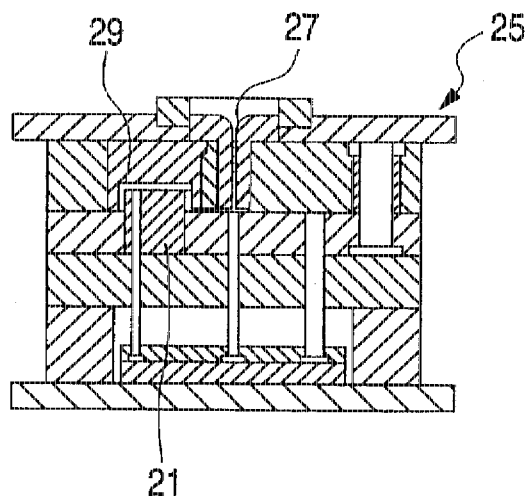

FIGS. 2(A) to 2(D) are views showing a procedure for forming a three-dimensional circuit body in the second embodiment of the method of producing a circuit board according to the present invention. FIG. 2(A) shows an electroplating step, FIG. 2(B) shows a bonding step under heat and pressure, FIG. 2(C) shows a heating and retaining step, and FIG. 2(D) shows a mold removing step.

First, as shown in FIG. 2(A), a convex mold 41 masked with an electrically insulating tape 42 or the like, is subjected to electroplating in the same manner as in the previous embodiment to thereby prepare a circuit body 43 made of a metal plating layer with a desired thickness (in this embodiment, the conductor thickness being from 100 to 300 μm). FIG. 2(A) shows mold 41 in the shape of a rectangular parallelepiped having a plurality of side surfaces and a top surface.

Then, as shown in FIG. 2(B), a board 45 made of a thermoplastic ABS resin is put on a concave mold 47, which is complementary in shape to convex mold 41, in a heated state and the board 45 is pressed into a cavity of the concave mold 47 by the convex mold 41 in a heated state from which the masking has been removed. In this embodiment, molding is performed by pressing the convex mold 41 under the condition of 10 kg/cm$^2$, heating the convex and concave molds 41 and 47 to 120° C. and increasing the pressure to the convex mold 41 up to 30 kg/cm$^2$.

As shown in FIG. 2(C), bonding under heat and pressure is performed by heating and retaining the convex and concave molds 41 and 47 till the circuit body 43 comes into close contact with the board 45 sufficiently. In this embodiment, after the aforementioned heating temperature is retained for about 5 minutes, the molds 41 and 47 are cooled to room temperature.

Then, as shown in FIG. 2(D), after the convex and concave molds 41 and 47 are cooled till the thermoplastic ABS resin gains a sufficient strength, the convex mold 41 is released from the board 45 to thereby obtain a resin molding casing 49 in which the three-dimensional circuit body 43 is transferred onto an inner surface of the board 45.

Examples of the resin material used for the boards 37 and 45 are, besides the aforementioned ABS resin, amorphous thermoplastic resins such as polycarbonate, polyether sulfone, etc. and crystalline thermoplastic resins such as polyethylene, polypropylene, etc. Examples of the material used for the circuit bodies 35 and 43 are copper, silver, etc.

As described above in detail, in the method of producing a circuit board according to the present invention, a circuit body made of a metal plating layer is formed on a mold and the mold is pressed against a board and heated and retained so that the circuit body is bonded to the board under heat and pressure. Accordingly, the electroless plating step is omitted so that no expensive catalyst is required. Accordingly, not only the producing time can be shortened but also the material cost can be saved.

Further, if a circuit body made of a metal plating layer is bonded to a board under heat and pressure after forming the circuit body on a mold surface of a convex mold, pressing the board into a cavity of a concave mold by the convex mold and heating and retaining the convex and concave molds, a three-dimensional circuit body can be transferred to an inner surface of a resin molding casing with a high position accuracy and, furthermore, the conductor thickness can be selected to be large even in the three-dimensional circuit body so that it transmits not only electric signals but also high electric power.

What is claimed is:

1. A method of producing a box-shaped molded casing having a circuit on its inner surfaces, comprising the steps of:

providing a male mold in the shape of a rectangular parallelepiped having a plurality of side surfaces and a top surface;

electroplating said surfaces of said male mold so that a circuit body made of a metal plating layer is formed on said surfaces of said male mold; placing a board made of a thermoplastic resin over an opening of a multi-sided three-dimensional female mold which is complementary in shape to said male mold; placing a board made of a thermoplastic resin over an opening of a multi-sided three-dimensional female mold which is complementary in shape to said male mold;

heating said board;

pressing said board into a cavity of said female mold with said male mold to form said board into a box-shaped casing having inner surfaces corresponding to said surfaces of said male mold;

retaining said male and female molds so that said circuit body is bonded to said inner surfaces of said casing under heat and pressure; and releasing said male mold from said female mold after cooling said casing, said circuit body having been transferred from said male mold onto said inner surfaces of said casing.

2. A method of producing a casing as claimed in claim 1, wherein said steps of heating and retaining are performed for about 5 minutes under temperature of about 120° C. and pressure of about 30 kg/cm$^2$.

* * * * *